United States Patent
Beck (10) Patent No.: US 8,369,999 B2
(45) Date of Patent: Feb. 5, 2013

(54) METHOD AND APPARATUS FOR FORECASTING SHADOWING FOR A PHOTOVOLTAIC SYSTEM

(75) Inventor: Bernhard Beck, Dimbach (DE)

(73) Assignee: Adensis GmbH, Dresden (DE)

( * ) Notice: Subject to any disclaimer, the term of this patent is extended or adjusted under 35 U.S.C. 154(b) by 435 days.

(21) Appl. No.: 12/792,058

(22) Filed: Jun. 2, 2010

(65) Prior Publication Data

US 2010/0309330 A1 Dec. 9, 2010

(30) Foreign Application Priority Data

Jun. 8, 2009 (DE) .......................... 10 2009 024 212

(51) Int. Cl.
- G05D 3/12 (2006.01)
- G05D 11/00 (2006.01)
- G01W 1/02 (2006.01)
- G06F 15/00 (2006.01)

(52) U.S. Cl. ............ 700/297; 700/295; 700/291; 702/3; 702/127; 382/103

(58) Field of Classification Search .................. 250/200; 382/103

See application file for complete search history.

(56) References Cited

U.S. PATENT DOCUMENTS

| | | | |
|---|---|---|---|
| 6,542,791 B1 | 4/2003 | Perez | |
| 7,171,328 B1 * | 1/2007 | Walker et al. | 702/136 |
| 7,181,345 B2 * | 2/2007 | Rosenfeld et al. | 702/3 |
| 7,274,975 B2 * | 9/2007 | Miller | 700/295 |
| 7,605,498 B2 * | 10/2009 | Ledenev et al. | 307/80 |
| 7,690,123 B2 * | 4/2010 | MacDonald | 33/268 |
| 7,719,140 B2 * | 5/2010 | Ledenev et al. | 307/80 |
| 7,858,875 B2 * | 12/2010 | Lu | 136/246 |
| 7,861,422 B2 * | 1/2011 | MacDonald | 33/268 |
| 7,873,490 B2 * | 1/2011 | MacDonald | 702/127 |
| 8,004,116 B2 * | 8/2011 | Ledenev et al. | 307/80 |
| 2004/0043760 A1 * | 3/2004 | Rosenfeld et al. | 455/414.3 |

(Continued)

FOREIGN PATENT DOCUMENTS

| | | |
|---|---|---|
| DE | 602004010281 | 10/2006 |
| EP | 0 984 413 | 3/2000 |

OTHER PUBLICATIONS

Nguyen, D. and Lehman, B., "Modeling and Simulation of Solar PV Arrays Under Changing Illumination Conditions", Jul. 2006, 2006 IEEE Compel Workshop, Rensselaer Polytechnic Institute, Troy, NY.*

(Continued)

*Primary Examiner* — Mohammad Ali
*Assistant Examiner* — Kelvin Booker
(74) *Attorney, Agent, or Firm* — Henry M. Feiereisen LLC (57) ABSTRACT

In a method for forecasting shadowing of a photovoltaic (PV) system due to cloud formation or movement, part of the firmament is imaged with fisheye optics onto the input optics of a digital camera. Pixel groups associated with luminous intensity ranges are formed. The spatial arrangement of the groups is analyzed to forecast shadowing of a photovoltaic system. A line extending from the PV system to the sun is formed and is continuously tracked. A reference line located inside a region around the line is formed. Passage of clouds across a reference line is analyzed. The result of the analysis is used to increase the electric power from the PV system to a minimum value through supply of additional backup energy or to reduce the electric power consumption by disconnecting users to ensure that key users do not experience a drop in supplied power below a minimum value.

16 Claims, 7 Drawing Sheets

U.S. PATENT DOCUMENTS

| | | | | |
|---|---|---|---|---|
| 2004/0187907 A1* | 9/2004 | Morgal | | 136/246 |
| 2007/0070531 A1* | 3/2007 | Lu | | 359/851 |
| 2007/0150198 A1* | 6/2007 | MacDonald | | 702/2 |
| 2007/0235071 A1* | 10/2007 | Work et al. | | 136/244 |
| 2008/0046217 A1* | 2/2008 | Polonskiy et al. | | 702/179 |
| 2008/0114546 A1* | 5/2008 | Kamel et al. | | 701/226 |
| 2009/0049702 A1* | 2/2009 | MacDonald | | 33/268 |
| 2009/0060352 A1* | 3/2009 | Distante et al. | | 382/224 |
| 2009/0218887 A1* | 9/2009 | Ledenev et al. | | 307/80 |
| 2009/0230237 A1* | 9/2009 | Tillotson | | 244/30 |
| 2010/0000517 A1* | 1/2010 | Zalusky | | 126/600 |
| 2010/0038968 A1* | 2/2010 | Ledenev et al. | | 307/82 |
| 2010/0061593 A1* | 3/2010 | Macdonald et al. | | 382/103 |
| 2010/0139105 A1* | 6/2010 | Macdonald | | 33/268 |
| 2010/0198420 A1* | 8/2010 | Rettger et al. | | 700/291 |
| 2010/0204844 A1* | 8/2010 | Rettger et al. | | 700/291 |
| 2010/0212720 A1* | 8/2010 | Meyer et al. | | 136/246 |
| 2010/0228481 A1* | 9/2010 | Kamel et al. | | 701/226 |
| 2010/0275904 A1* | 11/2010 | Bathurst et al. | | 126/600 |
| 2010/0302363 A1* | 12/2010 | Mackenzie | | 348/135 |
| 2011/0073160 A1* | 3/2011 | Lu | | 136/246 |
| 2011/0134268 A1* | 6/2011 | MacDonald | | 348/222.1 |
| 2011/0242802 A1* | 10/2011 | Work et al. | | 362/183 |
| 2012/0032515 A1* | 2/2012 | Ledenev et al. | | 307/63 |
| 2012/0121125 A1* | 5/2012 | Dimov | | 382/103 |
| 2012/0215372 A1* | 8/2012 | Kernahan et al. | | 700/298 |
| 2012/0239295 A1* | 9/2012 | Kamel et al. | | 701/531 |

OTHER PUBLICATIONS

Nguyen, D.D., "Modeling and Reconfiguration of Solar Photovoltaic Arrays Under Non-Uniform Shadow Conditions", Jan. 2008, Electrical Engineering Dissertation, Department of Electrical Engineering, Northeastern University.*

Solar Pathfinder, "Instruction manual for the Solar Pathfinder™", 2008, Retrieved from the Internet on Sep. 19, 2012, at "www.solarpathfinder.com".*

Solmetric Corporation, "Solmetric SunEye™ User's Guide, Version 2.8", Jan. 13, 2009, Retrieved from the Internet on Sep. 19, 2012, at "www.solmetric.com".*

* cited by examiner

METHOD AND APPARATUS FOR FORECASTING SHADOWING FOR A PHOTOVOLTAIC SYSTEM

CROSS-REFERENCES TO RELATED APPLICATIONS

This application claims the priority of German Patent Application, Serial No. 10 2009 024 212.0, filed Jun. 8, 2009, pursuant to 35 U.S.C. 119(a)-(d), the content of which is incorporated herein by reference in its entirety as if fully set forth herein.

BACKGROUND OF THE INVENTION

The present invention relates to a method and an apparatus for forecasting forthcoming shadowing of a photovoltaic system connected to a power grid due to cloud formation or cloud movement.

The following discussion of related art is provided to assist the reader in understanding the advantages of the invention, and is not to be construed as an admission that this related art is prior art to this invention.

Supply contracts with associated energy providers frequently require that the solar power plants are designed to supply to the power grid an agreed-upon minimum power within a determined time interval. For example, a 2.4 MW solar power plant may be required to supply between 11 AM and 5 PM at least 60% of the rated power, meaning about 1.5 MW. Depending on the weather, this minimum power cannot always be generated by the solar system alone. Backup power plants supplying DC current, for example a battery or a fuel-cell, must be switched in. For a longer forecast decrease in energy, an additional power plant must be commissioned on the AC side. This is implemented either by purchasing the required energy from another energy supplier by adding an additional power plant on the AC current side, for example in form of a diesel generator or a gas power plant. The respective energy suppliers have different startup times until the energy can be supplied. This ranges from the almost immediate discharge of a battery to approximately 5 minutes for starting out an additional power plant.

The decision, which measures are potentially the most appropriate, depends to a large degree from the incident sunlight to be expected on the area of the photovoltaic system. The energy supplier is generally interested in being informed about an impending decrease in the available energy. This can be addressed, for example, by early disconnection of users from the grid, whereby their operation can then be resumed at a later time. Such approach is indicated, for example, in the production of hydrogen.

It would therefore be desirable and advantageous to provide a method and an apparatus for identifying a impending undersupply and to rank its expected duration and severity, so that a selection can be made, which additional energy supplier should be prepared and provisioned for supplying the energy, so that the desired minimum power can be called up at any time, or that alternatively the disconnection of users from the grid can be initiated.

SUMMARY OF THE INVENTION

According to one aspect of the present invention, a method for preventing an impending decrease in electric power supplied by a photovoltaic (PV) system connected to a power grid below a limit value due to forthcoming shadowing caused by cloud formation or cloud movement, or both, includes the steps of analyzing the cloud formation or the cloud movement in a predetermined region between the PV system and a part of the firmament visible from the PV system, and deciding, based on results of the analysis, a need for enacting a measure for maintaining a minimum of supplied power into the power grid, or disconnecting at least one of the users.

According to another aspect of the invention, a device for preventing an impending decrease in electric power supplied by a photovoltaic (PV) system connected to a power grid below a limit value due to forthcoming shadowing caused by cloud formation or cloud movement, or both, includes a digital camera having an image sensor composed of pixels, fisheye optics imaging a visible part of the firmament at least partially onto a predetermined region of the image sensor, a memory device storing images of the region recorded at predetermined time intervals, a storage device storing parameters representing a solar trajectory, and a computing device. The computing device is configured to receive as an input a position of the sun at the predetermined time intervals together with at least two stored images, to compare the at least two images with each other, and to analyze a change in luminous intensity of the pixels in the at least two images with respect to the position of the sun.

As already mentioned above, the aforementioned measure may be the supply of additional energy, in addition to the energy generated by the PV system, into the power grid from a supplier of additional energy, or the additional measure may be the disconnection of less relevant users with a correspondingly lower priority from the grid.

According to a first embodiment of the method, the predetermined region is recorded by a digital camera, wherein images of the region which are composed of a plurality of pixels are recorded during time intervals, wherein the computed position of the sun is taken into account in the images, wherein consecutive images are compared with one another, and wherein the change in the luminous intensity of the pixels is analyzed in relation to the position of the sun and the reference point.

With this approach, a large part of the firmament is advantageously observed and cloud changes and cloud movement can be tracked and analyzed almost to the horizon. Marking the position of the sun in the images does not necessarily imply a visible mark, but is meant to indicate instead It that information about the position of the sun in the sky at the time of the recording is included in the images. This may occur while the images are recorded or later during additional processing of the image information.

Not every individual pixel needs to be processed separately. Alternatively, several adjacent pixels may be combined depending on the resolution of the camera and viewed as a composite pixel point, a large pixel point or a pixel aggregation point.

The feature "that the change in the luminous intensity of the pixels in relation to the position of the sun and the reference point is analyzed" indicates that the change in the luminous intensity of each pixel is measured from one image to the next, and that it is analyzed to which extent shadowing of the solar radiation by clouds at the reference point can be inferred from this change.

The time intervals may be periodic, whereby consecutive images that directly compared with one another. For example, an image may be generated every 2 to 5 seconds which is then compared with the previous image. If there are no changes during a certain time interval, as is the case for example for sunny or overcast weather, then this time interval may be successively increased and then again decreased after identifying a change.

Patterns in the change may advantageously be identified by not only comparing consecutive images, but also groups of images. A rather unstable, linear interpolation would result if only immediately consecutive images were compared. By analyzing image sequences, stable linear trends can be identified which can then be extrapolated into the future.

For modeling a cloud as realistically as possible, a plurality of contiguous pixels, which have the same luminous intensity or a luminous intensity within a predetermined tolerance range, may be combined into a group, and the migration of this group across the image region to other pixels may be monitored. For example, dark pixels with a light intensity that is only 10% to 15% of the maximum intensity for the calculated position of the sun, are combined into a group. In the next image, some pixels may fall outside this group because they have become brighter and are then associated with a different group. Other, previously brighter pixels may become correspondingly darker and are the accepted into the respective group. Accordingly, a change in the luminous intensity distribution takes place from one image to the next in the monitored region.

Advantageously, several groups with identical or different luminous intensity may be formed, wherein a motion vector is associated with each group, the length of which corresponds to the average intensity or velocity of all contributing pixels in the respective group and the direction of which corresponds to the average displacement direction of the luminous intensities in the image. Conversely, a low illumination or luminous intensity, which suggests a cloud and may be significant for shadowing, forms a correspondingly longer vector.

From the two parameters i) spatial extent of the group and ii) migration direction of the group, conclusions can be drawn if and how the group traverses a line between the reference point and the sun mark. Additional parameters, for example the rotation, the increase, the decrease or the change in the intensity may also be considered.

The aforementioned first embodiment advantageously considers cloud movements regardless of their altitude or the prevailing wind direction. It is also measured when cloud movements occur in different direction in one and the same region of an image, for example when a small black cloud at low altitude moves in front of a brighter cloud at higher altitude. All cloud movements with a tendency to approach the reference point while shadowing the solar radiation can thereby be filtered out and analyzed more closely. Likewise, clouds can be filtered out which approach the reference point, but do not intersect its line to the sun.

The second embodiment is based on the concept that, if the wind direction is known, one can look from the reference point to a location adjacent to the sun to recognize cloud movements that take place towards the reference point and will cause shadowing at a later time. Starting with this basic approach, according to an alternative to the previous embodiment, a line from the PV system or its immediate surroundings to the actual position of the sun is determined, the predetermined region is formed around this line, and passage of the clouds through this region is measured. In this way, the region quasi migrates with the position of the sun, and the region between the PV system and the sun is always observed. To analyze cloud movement, a horizontal reference line is placed in the region, and the passage or crossing of the clouds relative to the reference line is evaluated. A second reference line placed parallel to the first reference line enables determination of the velocity of the cloud movement.

Figure 2A:
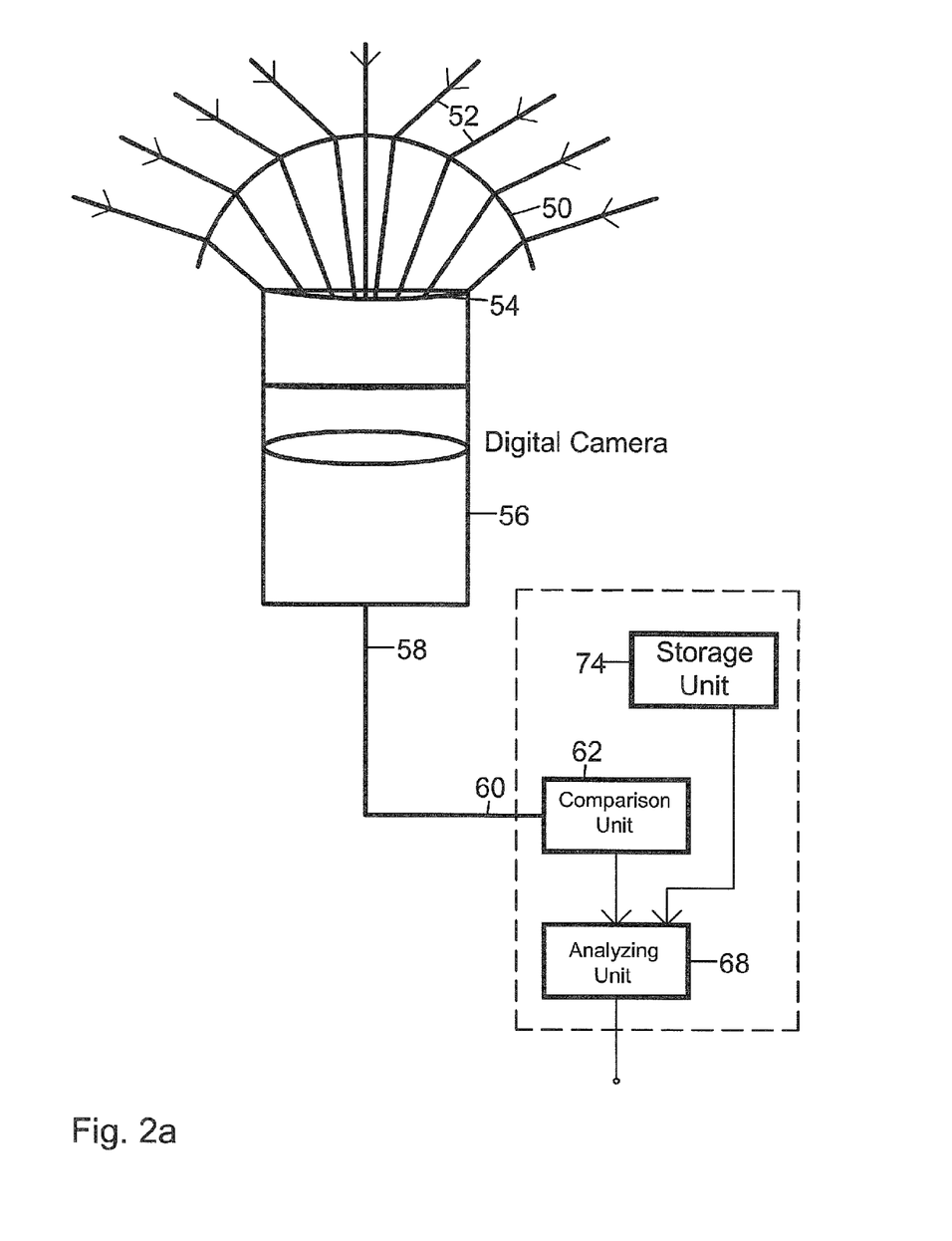
FIG. 2a-2c is a schematic diagram of an apparatus for carrying out the method of the invention.
Figure 2B:
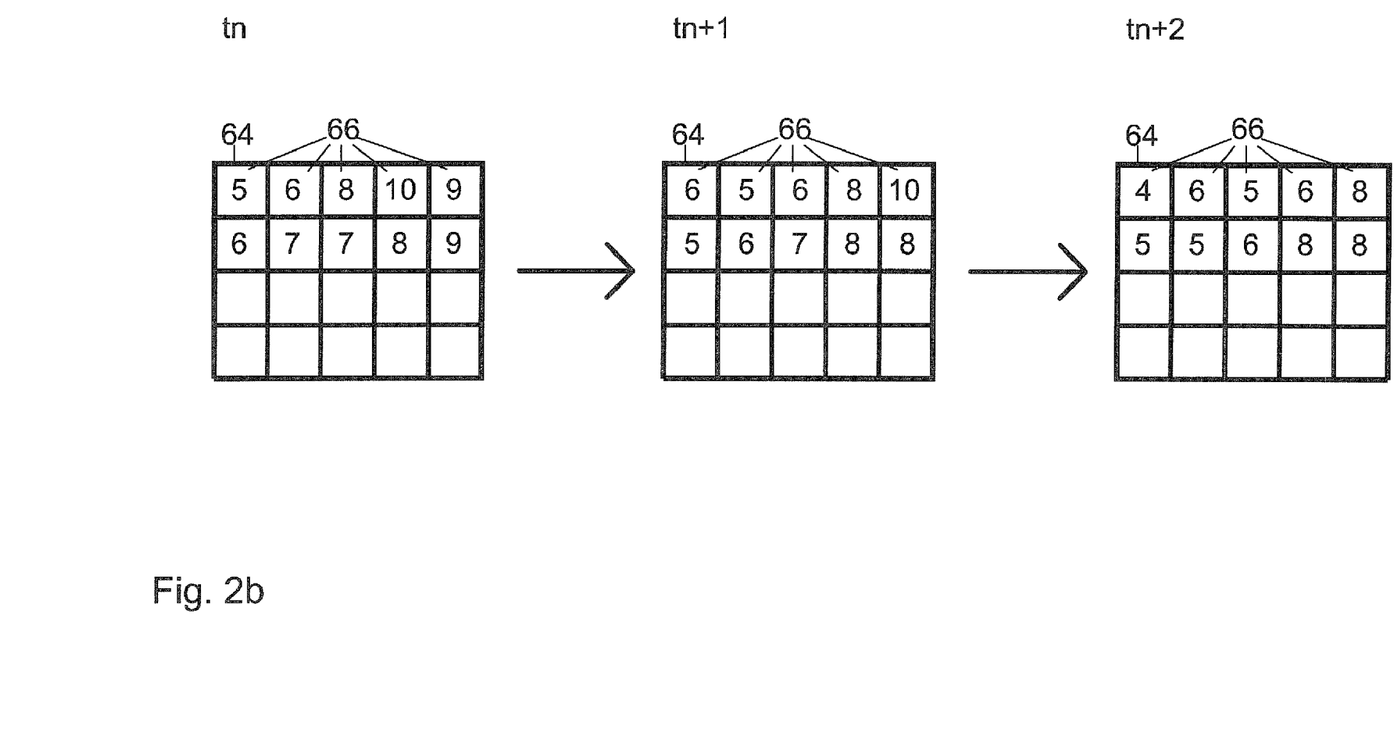
Figure 2C:
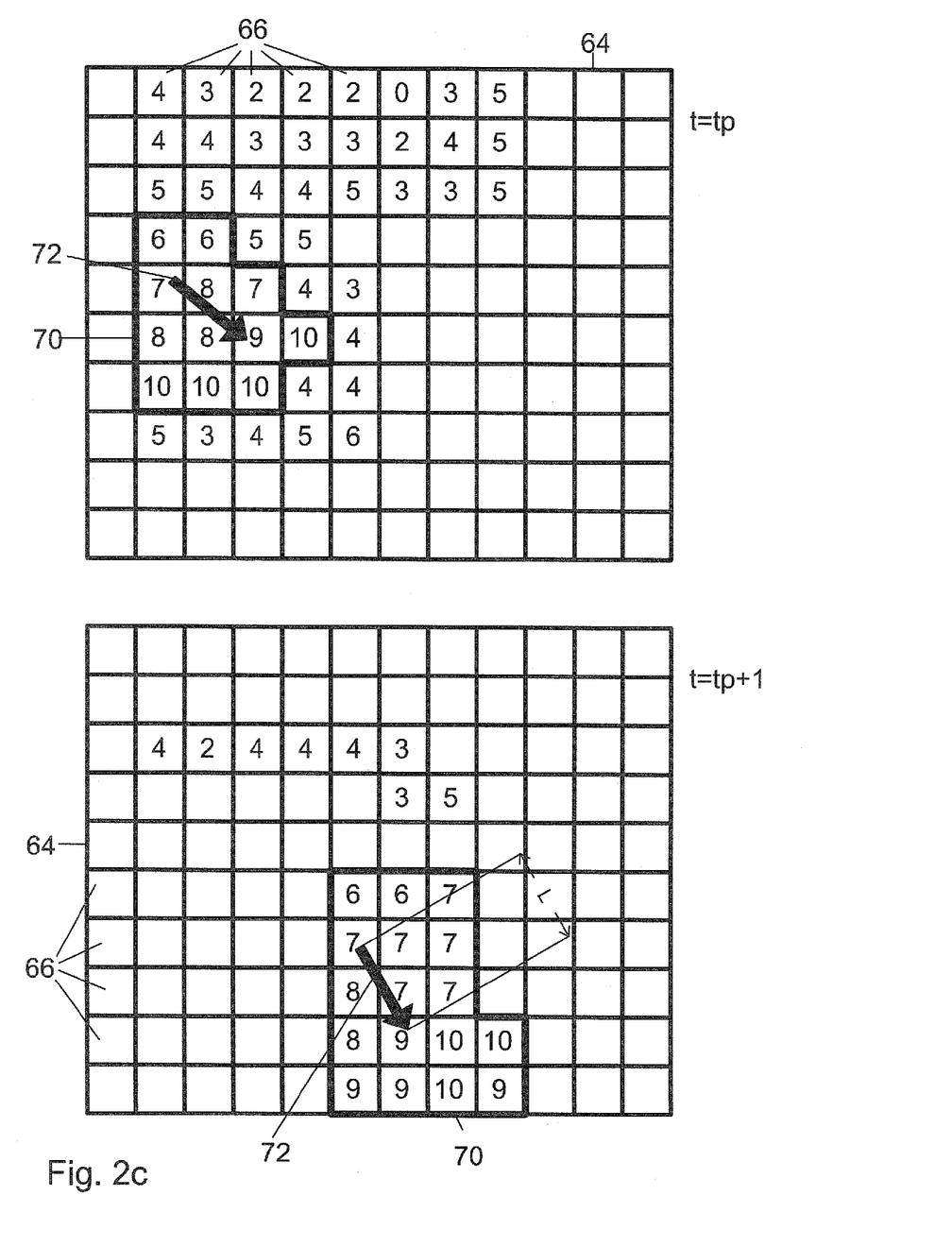

Because it is of no interest how the cloud movement or cloud formation continues to develop after passage across the PV system, the boundary of the region should be placed in relation to the line so that the boundary is located close to the line in the prevailing wind direction and far removed from the line in the direction opposite to the wind. The region is advantageously rectangular or elliptical, and the line is then located at the narrow edge of the rectangle or proximate to the focal point of the ellipse located in the wind direction. This will be explained hereinafter with reference to FIG. 2.

The size of the region changes permanently with the position of the sun, i.e., the angle between the line and the ground surface on which the photovoltaic modules are installed. When the sun is located vertically above the photovoltaic system, the region should have an extent of about 5 to 100 square kilometers, depending on the altitude of the cloud cover. A larger region is recommended for clouds passing at low altitudes than for clouds moving at high altitudes.

As described above, a measure based on the result of the analysis may be the supply of additional energy, in addition to the energy provided by the photovoltaic system, from a supplier of additional energy into the power grid. More particularly, a battery can be used to supply the additional energy, in particular when using electro-mechanical DC-AC converters with a DC motor in combination with a synchronous motor (where in the DC motor is powered by the photovoltaic system). If the power supplied by the solar system drops below the minimum power, then the deficit is supplied by the supplier of additional energy.

Because a battery can compensate the energy deficit only over a limited time of several minutes, it may make sense to prepare a backup power plant for supplying power into the grid, as soon as there is an indication that the drop below the minimum required power from the photovoltaic system is not just temporary, for example due to a single passing cloud. For this reason, connection of the battery should be synchronized with the startup of a backup power plant or with the connection of an already running backup power plant. The backup power plant is configured to supply DC current and may be a conventional diesel generator with a rectifier able to provide the additional power within about one minute, or a fuel cell. The elapsed time between the request from the control device to the actual correction of the DC motor is advantageously between 1 and 5 minutes, more particularly between 2 and 4 minutes.

One criterion leading to a request for additional power from a power plant may be, for example, that the electric power generated by the photovoltaic modules drops below a minimum value for a predetermined time interval. Another criterion may be that the product of the electric power generated by the photovoltaic modules, on one hand, and a time interval on the other hand (i.e., the integral over the power) drops below a predetermined minimum value. Additional criteria may take into account the nature of the observed power drop of the photovoltaic system, such as hard shadows, lighting changes, cirro-cumulus clouds, high fog and the like.

This forms the basis for the invention, in that these weather-related parameters are not evaluated based on the energy currently generated by the photovoltaic system, and to then decide after the fact, but to forecast the shadowing parameters in advance of the weather pattern, so as to make a decision about the most suitable approach for supplying additional energy (or disconnecting users), before the shadowing condition actually arrives.

Fisheye optics used in the apparatus which enables complete imaging of the visible firmament onto a camera is generally known in the art. With its large observation space, the fisheye optics can be arranged remote from an individual photovoltaic system. It may be, for example, located at the center of three solar fields (PV systems) and may accordingly consider in the calculation three reference points, one for each PV system. Early first forecasts are possible because the field of view essentially includes the horizon. A gathering thunderstorm may be identified very early. In addition, this embodiment does not depend on the wind direction, because the entire space above the PV systems can be observed.

The apparatus may include instead of the camera a light detector having a plurality of photocells arranged in a matrix and by an analysis device which analyzes the light incident on the photocells with respect to its distribution on the matrix and its intensity.

A lens which images the region onto the surface of the light detector is arranged above the light detector. Advantageously, a control device is provided which tracks the lens so that its center optical axis is oriented towards the sun. The light detector should be composed of a plurality of photocells, for example between 50 and 500 photocells, arranged in form of a matrix. If the region is elliptical, the lens should also be elliptical. An analysis device evaluates the distribution of the incident light on the plurality of photocells and its intensity with respect to the individual photocells or photocells combined into groups. The aforementioned horizontal reference line is formed by a number of photocells located on a straight line located preferably at the edge of the matrix. The position of the edge depends on the wind direction. For this purpose, the apparatus is configured to be rotatable, so it can be oriented according to the wind direction, so that the cloud migration is imaged on the matrix before reaching the photovoltaic system.

The analysis device will not be described further in this application. Such devices are generally known in the art, for example in the field of fire detection where, for example, the horizon is observed above a wooded area to detect spreading of white or dark fire plumes.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Figure 1:
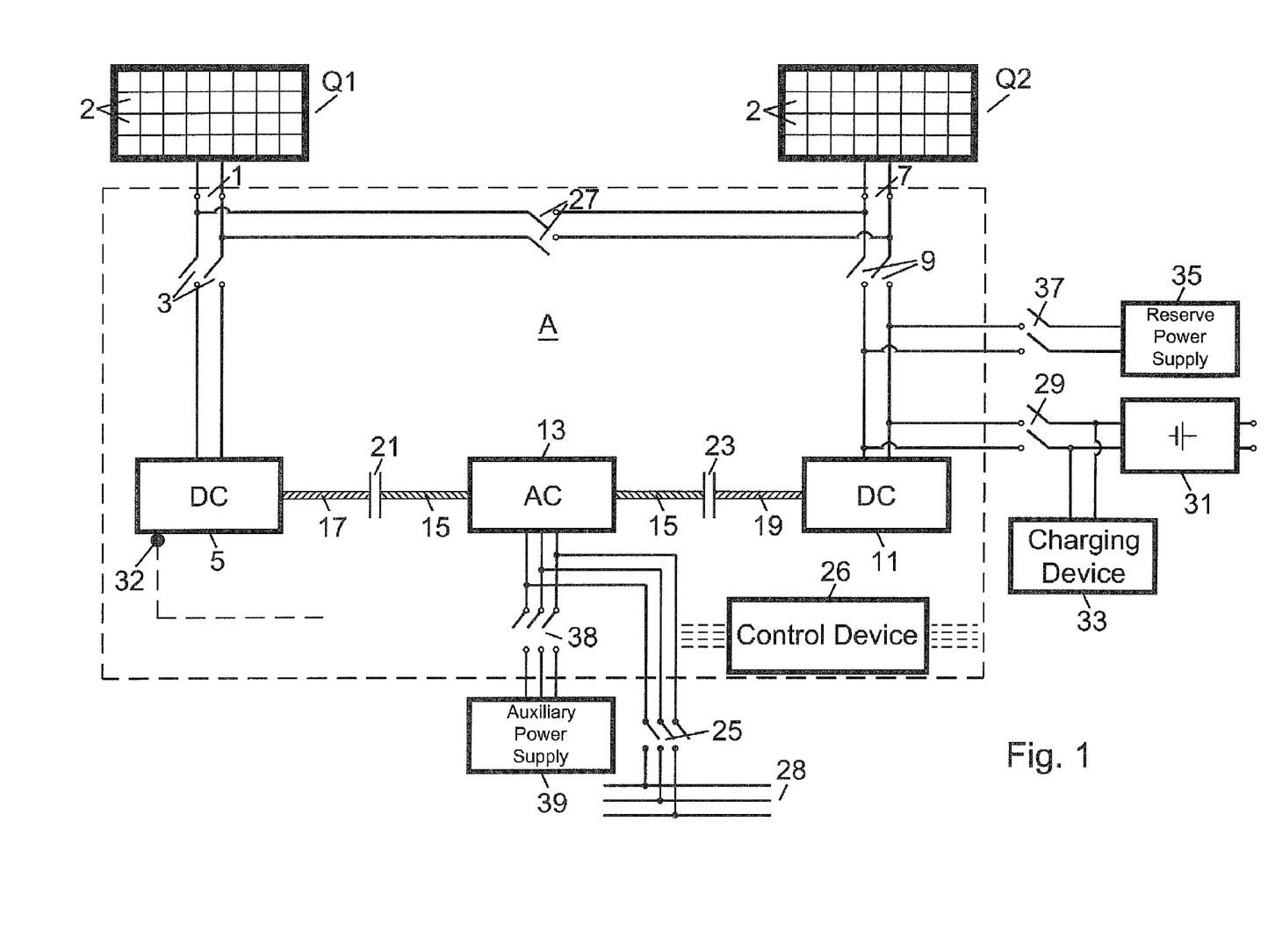
FIG. 1 is a schematic diagram of an electromechanical converter with two DC motors, a DC generator, a battery, a backup power plant, and an additional power plant.

Turning now to the drawing, and in particular to FIG. 1, there is shown a photovoltaic system A with a first subset of photovoltaic modules Q1 (not individually shown in FIG. 1) as a first energy source, which has an output first terminal pair 1 configured for supplying a DC voltage and a DC current. The output terminal pair 1 can be connected to a first externally-excited DC motor 5 by way of a first switch 3, for driving the DC motor 5.

Likewise, a second subset Q2 of photovoltaic modules representing a second energy source, which has a second output terminal pair 7 supplying a DC voltage U and a DC current I are shown on the right side of FIG. 1. The output terminal pair 7 can be connected to a second externally-excited DC motor 11 by way of a second switch 9, for driving the DC motor 11.

A three-phase generator 13 is arranged between the two DC motors 5, 11, with the shaft 15 of the three-phase generator 13 in alignment with the two motor shafts 17, 19 of the DC motors 5, 11. The generator shaft 15 extends outwardly from the left side on the right side of the DC generator 13 and is provided on each of the respective free ends with a respective coupling 21 and 23. The shafts 17, 19 of the DC motors 5, 11 can be separately connected to the three-phase generator 13. Alternatively, a fixed connection without couplings 21, 23 can also be implemented. The three-phase generator 13 includes an electric terminal 25 with a switch for connection to a power grid (shown in FIG. 1 outside of A).

Also provided is a control device 26 configured to control the switches 3 and 9 as well as to disconnect or connect the couplings 21, 23. The control device 26 is also equipped with a signal generator which actuates a bridge switch 27 which can the output terminals 1 and 7 with one another. During startup of the first DC motor 5, the bridge switch 27 is closed and the power from the second energy source Q2 is available at the input of the first DC motor 5 in addition to the power from the first energy source Q1. When the power of the first DC motor 5 reaches a predetermined value, in particular its nominal power, the bridge switch 27 is opened. The electric energy generated by the energy source Q2 is then used for a startup and subsequent operation of the second DC motor 11. When the rotation speed of its shaft 19 is matched to that of the shaft 25, the control device 26 transmits a signal for initiating the coupling process of the coupling 23. After successful coupling, the shafts 17, 19 together with the shaft 15 form a connected rotating assembly.

A battery 31 can be connected to the second DC motor 11 via a battery switch 29. The battery 31 is in turn connected with a charging device 33, in particular a rectifier charging device, selectively by way of an additional unillustrated switch, wherein the rectifier charging device is powered from the power grid 28.

If the terminal 25 is unable to supply a defined minimum power to the power grid 28, then the control device 26 is configured to initially open the switch 9, to regulate the voltage of the second DC motor 11 to match the battery open-circuit voltage through a change in the excitation of the second DC motor 11, and to subsequently close the battery switch 29 for supplying additional energy into the system A in addition to the solar energy. The additional energy is supplied by decreasing the motor voltage on the second DC motor 11 after the battery switch 29 is closed, which causes power to flow from the battery 31 to the DC motor 11.

Preferably, both the first DC motor 5 and the second DC motor 11 may be connected to the battery 31. It is hereby immaterial if a change-over switch is provided or if the battery 31 is divided into two separate batteries, e.g. 31*a*, 31*b*, with one of the two separate batteries 31*a*, 31*b* associated with the first DC motor 5 and the other battery 31*b*, 31*a* with the second DC motor 11. This measure is important in the context of the following evaluation regarding heat-up of the DC current machines 5, 11.

To prevent damage to the DC current machines 5, 11, a temperature monitoring device is advantageously provided. To this end, the control device 26 receives from a sensor 32 a measurement value representative of the temperature of the first DC motor 5. It will be assumed that the first DC motor 5 starts up and the second motor 11 runs on the battery 31. The first motor 5 is at risk of overheating. A safety measure is implemented in that, when a predetermined temperature limit is exceeded, the battery 31 is switched over from the first DC motor 5 previously supplied by the photovoltaic system Q1 and Q2 to the other DC motor 11, whereas the other DC motor 11 previously driven only from the battery 31 is now driven from the photovoltaic system Q1+Q2. The situation is therefore reversed.

Advantageously, both DC motors 5, 11 may be provided with a device for monitoring the temperature, because both the DC motor which receives the entire load of the photovoltaic system may overheat, as well as the other DC motor which is supplied with the high battery current at low voltage. The control device 26 must here provide equalization by optionally switching several times between the energy sources, namely solar energy on one hand, and battery 31 (backup source) on the other hand.

The individual DC motors 5, 11 may still be overloaded even if they only supply a portion of the total nominal power. This situation occurs when the minimum power of, for example, about 70% of the nominal power (from first and second energy source Q1, Q2 combined) is not attained, but the PV system (Q1 and Q2 combined) still supplies 60% of its nominal power. In this situation, the energy supplied by the second energy source Q2 is diverted to the first DC machine 5 by closing the bridge switch 27, with the first DC machine 5 now receiving 60% of the total energy. This represents an overload of 20% relative to half of the total power for this DC motor 5.

This will now be illustrated in the following numerical example: a solar system with a total of 2.4 MW is installed. This system is subdivided into parts of equal size, so that the power supplied by Q1 is equal to the power supplied by Q2, namely 1.2 MW each. The actual incident solar radiation supplies a power of 1.4 MW; however, to meet the supply contract with the energy supplier, 70% of the nominal power, namely 1.68 MW, must be supplied. After the switch 9 is opened and the bridge switch 27 is closed, 1.68 MW is supplied to the first DC motor 5. However, this represents 0.24 MW (=20% of the nominal power) more than the continuous power rating of the first DC motor 5. The missing 0.24 MW is then supplied to the second DC motor 11 from the battery, which corresponds to a current of 2400 amperes at a battery voltage of 100 V.

Accordingly, both DC motors 5, 11 should be provided with a device for temperature monitoring to prevent overheating. If the reduced amount of power supplied by the photovoltaic system (Q1+Q2) may last for an extended period of time of several minutes, then the embodiment illustrated in FIG. 1 must be implemented in order to guarantee that a minimum quantity of energy is supplied to the power grid 28.

FIG. 1 also shows a DC backup power plant 35 which can be connected to the second DC motor 11 by way of an additional switch 37. The battery 31 can only be used to briefly compensate for an energy shortage in order to supply the contracted power from the PV system A. If the reduced power output continues, then the backup power plant 35 instead of the battery 31 may be connected to the second DC motor 11. Depending on the selected backup power plant 35, different startup times are required to set up a connection of the backup power plant 35. The setup time for a diesel generator with a rectifier is about 1 minute until the final operating state is reached, whereas the setup time for a fuel cell may be several minutes. Accordingly, the control device 26 must be designed to start up the backup power plant 35 early, to avoid the risk that the battery 31 is drained before being connected.

According to one criterion, a connection may be initiated when the electric power generated by the photovoltaic modules drops below a minimum value for a predetermined time interval. This means, for example, that the connection process is initiated as soon as the photovoltaic system Q1, Q2 remains below the minimum power level for about 1 minute and the battery 31 needed to be connected during this one minute. According to another criterion, a connection may be initiated when the product of the electric energy produced by the photovoltaic modules and a time interval is less than a predetermined minimum value. In other words, the backup power plant 35 may be connected when 20% of the battery capacity is used up over a time of 6 minutes, because energy from the battery was used to make up for the power deficiency in order to cover the contractually guaranteed power.

It is essentially unimportant if the criteria are designed to use as a basis for the calculation the time when the backup power plant is set up or the time when the actual connection is made. In a second case, the required setup time of the backup power plant must be included in the calculation.

The backup power plant 35 is therefore used, on one hand, to rapidly charge the battery 31 and, on the other hand, to provide the minimum power for a relatively short time of, for example, 5 to 20 minutes.

If it can be foreseen that the additional power from the battery 31 and the backup power plant 35 may be required for a longer time of, for example, between 20 minutes and several hours, then an additional power plant 39 is switched in on the AC side via a switch 38. This additional power plant 39 may be located remote at a different location in the supply grid 28. For example, the additional power plant 39 may be a gas-fired power plant which can be ready to supply energy after a setup time of about 4 minutes. The control device 26 can here also be used for start-up and/or connection of the additional power plant.

FIG. 2*a* shows fisheye optics 50 which collimates onto the optics 54 of a digital camera 56 solar radiation 52 incident from all directions. These devices are known in the art. The camera 56 has an electrical output 58 which is connected to the input 60 of a comparator 62. The comparator 62 compares in particular consecutive images from the camera 56, which may be accomplished, for example, by evaluating the incident luminous intensity pixel-by-pixel, as illustrated schematically in FIG. 2*b*. The temporal spacing of the individual consecutive images may preferably be identical.

FIG. 2*b* shows a small segment 64 of the pixel set from three digital images, which were sequentially produced at the times $t_n$, $t_{n+1}$ and $t_{n+2}$ in form of a matrix. In the uppermost row of the matrix on the left, five adjacent pixels 66 with associated luminous intensity values 5-6-8-10-9 at the time $t_n$ are illustrated. The row underneath has the luminous intensity values 6-7-7-8-9. A large luminous intensity value corresponds here to a large intensity.

In the subsequent image taken at the time $t_{n+1}$ the cloud cover has moved somewhat with the result that in the new value of the leftmost pixel introduced in the evaluated segment of the matrix is equal to 6, while the other pixels 66 of the uppermost row have moved to the right without changes in their luminous values. The segment 64 of the pixel set shown at the time $t_{n+2}$ shows an additional shift in the uppermost row, with the left pixel 66 now having the value 4, whereas all other pixels are shifted to the right unchanged.

The situation is different in the lower row on the pixels 66 that has intensity values. At the time $t_{n+1}$, the center pixel 66 previously assigned the value of 7 has become somewhat brighter and now has the value 8 (fourth pixel from the left). Likewise, the center pixel with the value 7 at the time $t_{n+1}$ undergoes the same change one image later at the time $t_{n+2}$, having now the value 8. Depending on the employed camera 56, this comparison is performed for thousands of pixels 66.

The output signal of the comparison unit 62 is supplied to a computing or analysis unit 68 which evaluates the changes in the intensity distribution on the matrix 64 described with reference to FIG. 2a. The evaluation includes both a change in the value of the pixels 66 as well as an analysis of the shift of the light or dark regions. For example, a contiguous pixel group having brightness values between 6 and 10 can be formed. This pixel group includes, depending on the cloud cover, a number of pixels 66. The analysis unit 68 then observes the displacement of this group as a whole, as illustrated in FIG. 2c. A somewhat larger matrix segment 64 is shown in the upper image at a time $t_p$, wherein a group 70 has 12 contiguous pixels 66 each having an intensity value between 6 and 10. In a subsequent image at the time $t_{p+1}$, the group 70 has shifted somewhat to the right; it has at the same time become larger and now includes 17 pixels which fall into the predetermined brightness region or tolerance range between 6 and 10. Each group 70 can be assigned a vector or arrow 72 which characterizes the intensity distribution within the group 70. The length L of the arrow 72 is a measure for the average brightness of the group 70. The intensity distribution between the corresponding images can be determined by comparing the arrows 72 at different times, for example at $t_p$ and $t_{p+1}$. This change can be most prominently illustrated by providing each group 70 with a vector 72. In this way, a large number of groups 17 can be formed (also with overlapping sets of pixels) which, on one hand, represent the same intensity level and, on the other hand, cover regions with lower and higher intensity.

Returning to FIG. 2a, there is also shown a memory device 74 which stores the trajectory of the sun as seen from the fisheye optics 50. When the fisheye optics 50 is located at the location of the photovoltaic system, it also forms a reference point. The trajectory of the sun may be stored, for example, by entering the coordinates describing the position of the sun at a predetermined time. It is sufficient if the coordinates of the associated position of the sun are stored for a duration of, e.g., 10 minutes, i.e., six coordinate pairs per hour. The trajectory of the sun need not be stored in table form, but maybe computed based on known formulae and stored for each image.

The input data, i.e., the camera images or, as illustrated in FIG. 2a, already their comparison with each other obtained with the comparison unit 68, as well as the coordinates of the position of the sun, are processed in the analysis unit 68 and associated with the reference point(s), i.e., the location where the photovoltaic system is installed. It typically result is described with reference to FIGS. 3a and 3b.

Figure 3A:
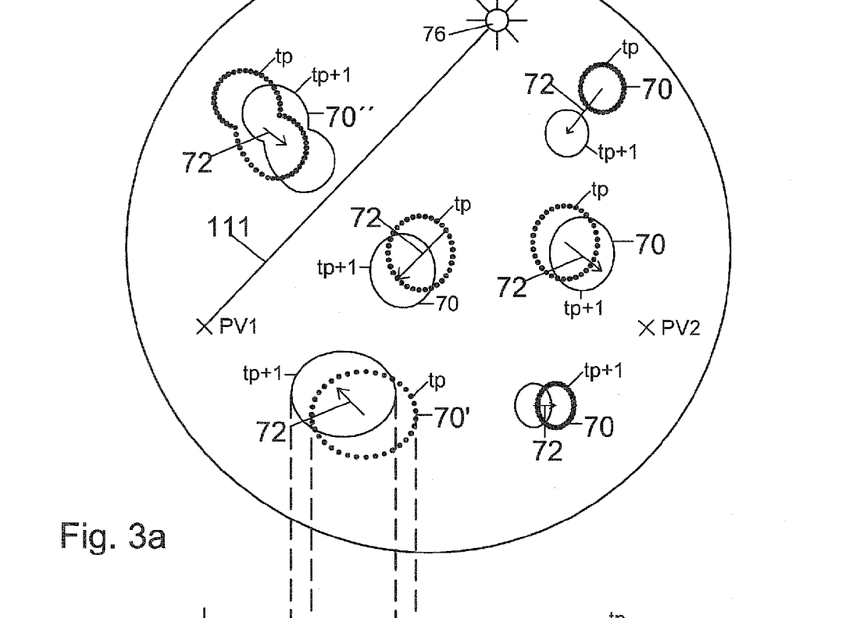
FIGS. 3a-3b shows a result of an analysis, obtained with a first embodiment of the invention.

The entire visible region of the fisheye optics 50 is shown in the upper FIG. 3a as a camera recording, in a manner in which the camera recording is rendered when the entire visible firmament is to be observed. For sake of simplicity, the region is illustrated as a circle, wherein the locations of two photovoltaic systems PV1 and PV2 are shown as stationary reference points. Also included in the camera image is the visible position 76 of the sun. A plurality of groups 70 with their associated vectors 72 is located within the camera image. The image represented in FIG. 3a is only an instantaneous image recorded at a fixed point in time t. This image is updated after each camera image has been recorded and analyzed.

Figure 3B:
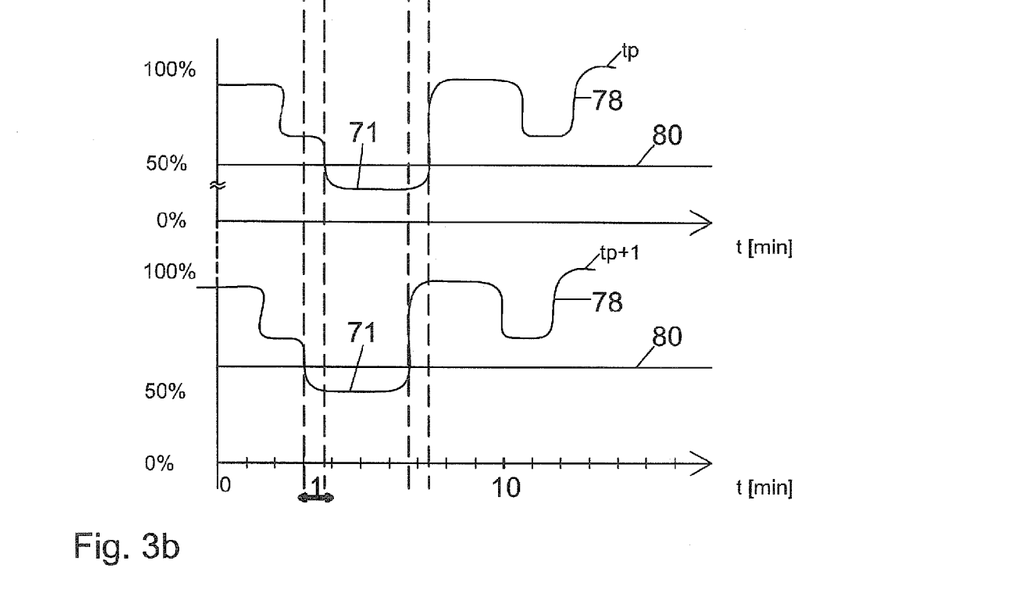

The lower FIG. 3b shows for the first photovoltaic system PV1 an exemplary course 78 of the forecast intensity of the incident solar radiation for time of one minute. Within this time period, the sink 71 which belongs to the group 70 at the lower left, has migrated to the left. Typically, not only a single group 70 is observed. Instead, all vectors 72 are evaluated to determine which of the groups 70 approaches the reference point PV1. It is then determined for these groups when they will arrive the reference point PV1 by taking account their migration speed and how long they will remain above the reference point PV1, before they move to a location where they no longer pose a risk of shadowing. In the illustrated example of FIG. 3a, these are the two groups 70 and 70", where a comparison between $t_p$ and $t_{p+1}$ suggests that there is a risk that these groups move between the position of the sun 76 and the reference point PV1. As a result, according to FIG. 3b, a decrease in the intensity is to be expected in about three minutes, which will then have passed after about 4 minutes (corresponding to the width of the group 70'). The intensity in the sink 71 drops below the threshold value 80 which is 60% of the maximum luminous intensity expected for this position of the sun. If a drop below this threshold value 80 is indicated, then it would be advisable to inform the energy supplier or the operator of the system of an unacceptable undersupply, so that one of the aforementioned measures can be taken. It will be understood that these measures may also be implemented immediately with the help of the control device.

It will be understood that the described components, such as the memory unit 74, the comparison unit 62 and the analysis unit 68, may not be viewed as separate components but rather describe the function to be provided. Accordingly, these components can be realized in a single electronic component. The attributed function should also not be viewed selectively, meaning that comparison of the image data and their analysis may be combined as far as practicable.

Figure 4A:
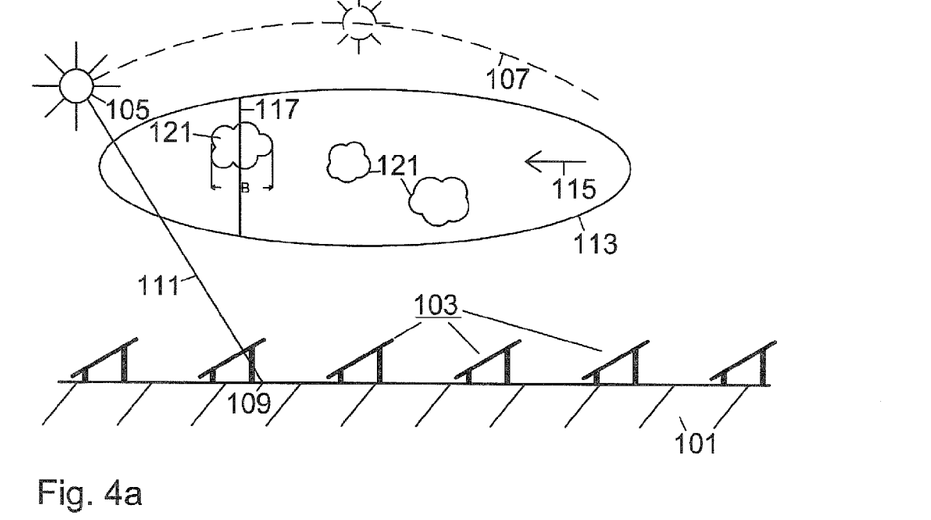
FIG. 4a-4b is a schematic diagram depicting the operation of the method for two different positions of the sun and wind directions according to a second embodiment.
Figure 4B:
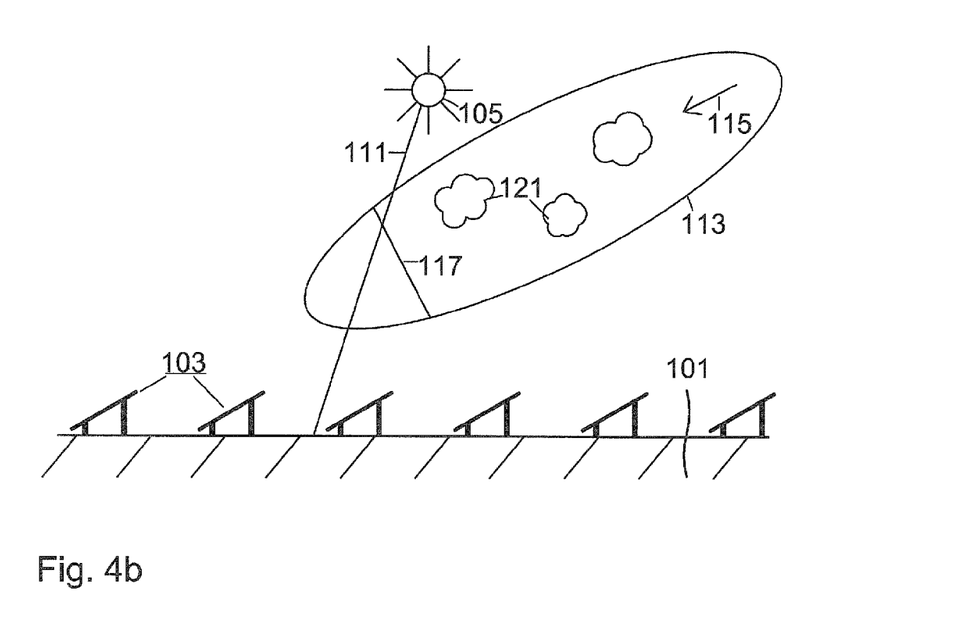

FIGS. 4a and 4b show schematically a large photovoltaic system 103 with an output power of several megawatts which is installed on a ground 101 in North-South direction. The sun 105 which travels along the arc 107 in East-West direction is indicated symbolically above the ground 101.

A line 111 is located between the sun 105 and a point 109 inside or proximate to the photovoltaic system 103. This is a determined line 111 which changes with the change in the position of the sun along the arc 107, see FIG. 4b. The line 111 can be determined, for example, by starting from the point 109 as the initial point and selecting the brightest point on the firmament as an endpoint, with the line 111 being formed as a straight line through these two points. FIG. 4b shows the line 111 at a later time of the day than in FIG. 4a.

A region 113 is formed around the line 111 which marks the field within which the cloud movement occurs. The cloud movement is here symbolized by an arrow 115 which indicates the prevailing wind direction. The region 113 is here defined as the plane parallel to the ground surface 101. For sake of clarity, the region 113 in FIGS. 4a and 4b is tilted by 90° and shown as a corresponding ellipse. A reference line 117 is drawn inside the region 113, extending essentially perpendicular to the wind direction 115. Passage of clouds 121 across the reference line 117 is monitored with an evaluation unit (not shown) located on the ground. It is determined how long it takes for the cloud 121 to move through the reference line 117. The actual or average width B of the cloud(s) is also determined. From these data, the time is determined before the cloud(s) 121 move(s) in between the PV system 103 and the sun 105. The extent of shadowing can also be determined from the velocity and the width B of the cloud(s). The computed result are then used to assess the need for backup energy due to the expected shadowing, in order to determine the minimum power of the energy supplied by the photovoltaic system 103 to the grid 28. For example, a backup battery is sufficient for individual clouds 121 traversing the reference line 117. For a denser cloud cover, preparation for provisioning a fuel cell would be advisable. For a very dense cloud cover or high fog blocking the solar radiation, which may last for several hours, a backup power plant should be arranged.

FIG. 4b shows the same situation at a later position of the sun 105. The line was adapted to the new position of the sun. The wind has also slightly shifted and now blows from a different direction 115, so that the elliptical region 113 together with the reference line 117 were rotated accordingly.

Figure 5:
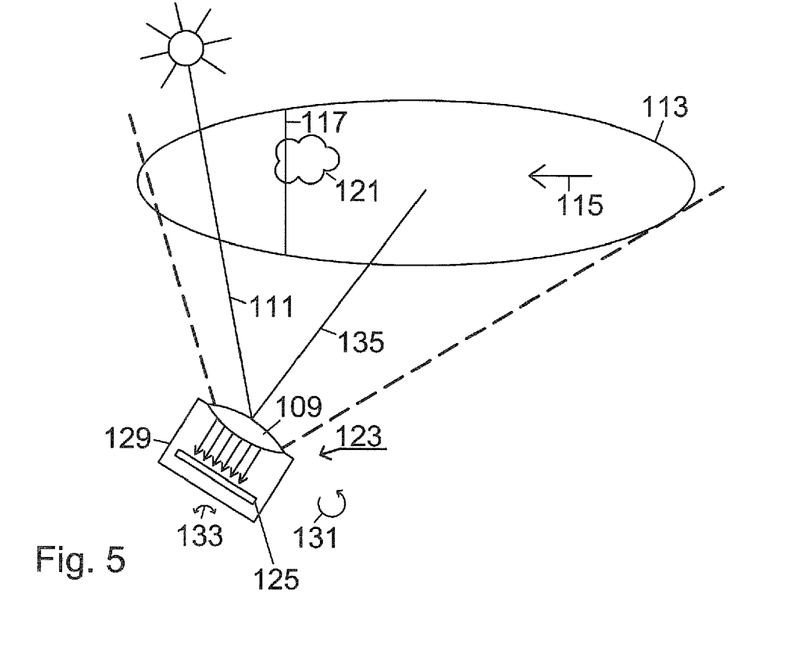
FIG. 5 is a schematic diagram of the apparatus for carrying out the method.

FIG. 5 shows an optical system 123, symbolically indicated by a simple convex lens, located near the point 109. No fisheye optics is implemented. The optical system 123 collects the obliquely incident light rays from the region 113 and projects them as substantially parallel radiation onto a flat matrix 125 of photocells 127, see FIG. 6. The optical system 123 together with the fixedly connected matrix 125 is housed in a housing 129 which is supported for rotation along a first double arrow 131 and for tilting along a second double arrow 133. This can be implemented, for example, by a cardan joint or ball joint. The joint is controlled by an unillustrated control device so that the optical system 123 is always able, depending on the prevailing wind direction 115 and the prevailing position of the sun, to analyze the region 113 for the presence of clouds 121, before these clouds 121 shadow the photovoltaic system. The optical system 123 is oriented so that its central optical axis 135 points to the center of the region 113. The size of the matrix 125 is selected accordingly, so that the entire region 113 is imaged onto the matrix 125.

Figure 6:
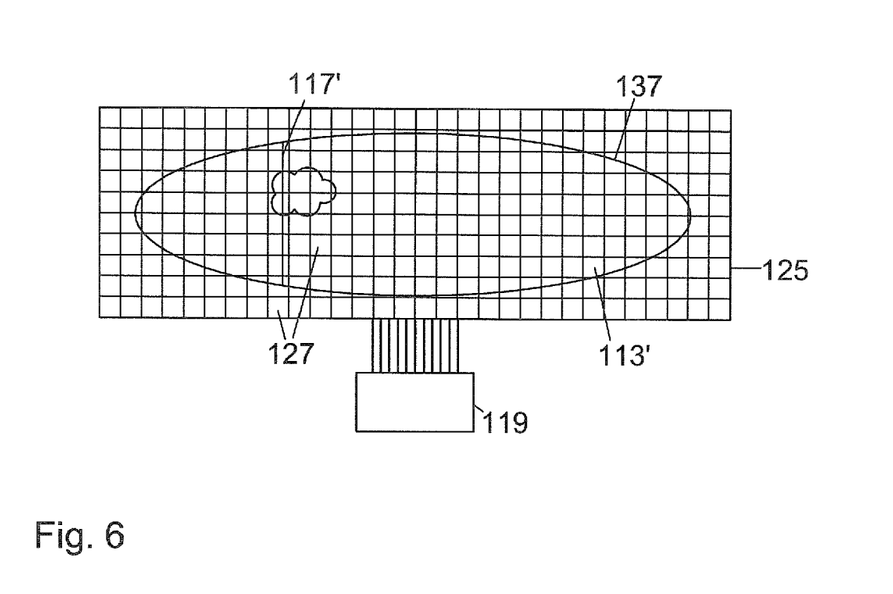
FIG. 6 shows a matrix of photocells with a distribution of the incident light in the presence of a cloud.

This is shown more clearly in FIG. 6, which shows the matrix 125 in a top view. The matrix 125 consists of a plurality of photocells 127 arranged in a rectangle. The rectangle is dimensioned so that the imaged region 113', which is indicated in FIG. 6 by its outer peripheral line 137, fits into the rectangle. The imaged region 113' corresponds to the region 113 between the photovoltaic system 103 and the sun 105 processed by the lens system. In particular, the photocells 127 are individually connected to the evaluation unit 119. The position of the photocells 127 inside the matrix is correlated in the evaluation unit 119 with the received signal strength of the associated photocell and also correlated with the imaged reference line 117'. The evaluation unit 119 is then able to recognize early on the decrease in luminous intensity expected during passage of clouds, and to initiate one of the aforementioned countermeasures.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein.

What is claimed is:

1. A method for preventing an impending decrease in electric power supplied by a photovoltaic (PV) system connected to a power grid and by a connectable additional supplier of electric energy associated with the PV system below a limit value due to forthcoming shadowing caused by cloud formation or cloud movement, or both, comprising the steps of:
    analyzing the cloud formation or the cloud movement in a predetermined region between the PV system and a part of the firmament visible from the PV system,
    determining with a computing device, based on results of the analysis, a need for enacting a measure for maintaining a minimum of supplied power into the power grid,
    measuring the predetermined region with a camera,
    acquiring with the camera at predetermined time intervals images of the region, wherein the images are composed of a plurality of pixels,
    marking in the images a computed position of the sun,
    comparing sequential images with one another, and
    analyzing a change in the luminous intensity of the pixels with respect to the computed position of the sun and a location of the camera.

2. The method of claim 1, wherein the measure comprises connecting the additional supplier of additional electric energy to the power grid and supplying the additional electric energy from the additional supplier of additional energy to the power grid, in addition to the power supplied by the PV system.

3. The method of claim 2, wherein the measure of supplying additional energy into the power grid further comprises determining an expected required quantity of additional energy.

4. The method of claim 1, wherein the predetermined time intervals are periodic, and wherein consecutive images are compared with one another.

5. The method of claim 1, further comprising the steps of:
    combining a plurality of contiguous pixels having identical luminous intensity or a luminous intensity located in a predetermined tolerance range, into a group, and tracking migration of the group across the imaged region to other positions.

6. The method of claim 5, further comprising the steps of:
    forming several groups having identical or different luminous intensities, and
    associating a motion vector with each group, with a length of the motion vector corresponding to an average velocity of all pixels in a respective group, and a direction of the motion vector corresponding to a displacement direction of the luminous intensities in an image.

7. The method of claim 5, wherein parameters related to a spatial extent of the group and a migration direction of the group indicate, if and how the group crosses a line between the location of the camera and the marked position of the sun.

8. The method of claim 1, wherein the camera is a digital camera.

9. The method of claim 1, further comprising the steps of:
determining a line originating at the PV system or its immediate surroundings and extending to an actual position of the sun,
forming the predetermined region around the line, and
determining passage of the clouds through the predetermined region.

10. The method of claim 9, further comprising the steps of:
determining a prevailing wind direction, and
by taking into account the prevailing wind direction, placing the edge of the predetermined region oriented in the prevailing wind direction proximate to the line.

11. The method of claim 9, further comprising the steps of:
placing a first horizontal reference line in the predetermined region, and
analyzing passage of the clouds in relation to the first horizontal reference line.

12. The method of claim 11, further comprising placing in the predetermined region a second horizontal reference line which extends parallel to the first horizontal reference line, and
analyzing passage of the clouds in relation to the first and second reference line.

13. The method of claim 11, further comprising the steps of:
determining a time for the cloud to move through the first horizontal reference line,
determining an actual or average width of the cloud or a speed of the cloud, or both,
determining from the width or speed a time before the cloud moves in between the PV system and the sun.

14. The method according to claim 1, wherein the predetermined region has an extent of between 5 and 100 $km^2$ of cloud pattern.

15. A device for preventing an impending decrease in electric power supplied by a photovoltaic (PV) system connected to a power grid and by a connectable additional supplier of electric energy associated with the PV system below a limit value due to forthcoming shadowing caused by cloud formation or cloud movement, or both, comprising:
a digital camera having an image sensor composed of pixels,
fisheye optics imaging a visible part of the firmament at least partially onto a predetermined region of the image sensor,
a memory device storing images of the region recorded at predetermined time intervals,
a storage device storing parameters representing a solar trajectory, and
a computing device configured to receive as an input a position of the sun at the predetermined time intervals together with at least two stored images, to compare the at least two images with each other, and to analyze a change in luminous intensity of the pixels in the at least two images with respect to the position of the sun.

16. The device of claim 15, wherein the image sensor is configured as a light detector having a plurality of photocells forming the pixels and arranged in a matrix, the device further comprising an analysis unit configured to analyze an intensity distribution of light incident on the plurality of photocells.

* * * * *